(12) United States Patent
Tayebati et al.

(10) Patent No.: US 11,391,958 B2
(45) Date of Patent: Jul. 19, 2022

(54) WAVELENGTH BEAM COMBINING LASER SYSTEMS WITH MICRO-OPTICS

(71) Applicants: Parviz Tayebati, Sherborn, MA (US); Bien Chann, Merrimack, NH (US); Robin Huang, North Billerica, MA (US); Wang-Long Zhou, Andover, MA (US)

(72) Inventors: Parviz Tayebati, Sherborn, MA (US); Bien Chann, Merrimack, NH (US); Robin Huang, North Billerica, MA (US); Wang-Long Zhou, Andover, MA (US)

(73) Assignee: TERADIODE, INC., Wilmington, MA (US)

( * ) Notice: Subject to any disclaimer, the term of this patent is extended or adjusted under 35 U.S.C. 154(b) by 191 days.

(21) Appl. No.: 16/840,867

(22) Filed: Apr. 6, 2020

(65) Prior Publication Data
US 2020/0355931 A1    Nov. 12, 2020

Related U.S. Application Data

(63) Continuation of application No. 15/789,092, filed on Oct. 20, 2017, now Pat. No. 10,649,222, which is a
(Continued)

(51) Int. Cl.
*G02B 27/10* (2006.01)
*G02B 5/18* (2006.01)
(Continued)

(52) U.S. Cl.
CPC ........... *G02B 27/1006* (2013.01); *G02B 5/18* (2013.01); *G02B 19/0057* (2013.01);
(Continued)

(58) Field of Classification Search
CPC .. G02B 5/18; G02B 19/0057; G02B 27/1006; G02B 27/1086; G02B 27/4244; H01S 5/4062
(Continued)

(56) References Cited

U.S. PATENT DOCUMENTS

| 4,847,479 A | * | 7/1989 | Clark | .................... H01S 5/0687 250/201.1 |
|---|---|---|---|---|
| 5,333,077 A | | 7/1994 | Leger et al. | |

(Continued)

FOREIGN PATENT DOCUMENTS

| JP | 2007165624 | 6/2007 |
|---|---|---|
| WO | 2006/045303 | 5/2006 |
| WO | 2006097531 | 9/2006 |

OTHER PUBLICATIONS

International Search Report and Written Opinion issued in corresponding International Patent Application No. PCT/US2015/022236 dated Jul. 7, 2015.
(Continued)

*Primary Examiner* — William R Alexander
(74) *Attorney, Agent, or Firm* — Morgan, Lewis & Bockius LLP

(57) ABSTRACT

In various embodiments, wavelength beam combining systems feature multiple beam emitters each emitting an individual beam, as well as multiple micro-optics arrangements each disposed optically downstream from a beam emitter to intercept the beam emitted thereby and direct the beam toward a dispersive element for combination into a multi-wavelength output beam.

22 Claims, 15 Drawing Sheets

Related U.S. Application Data continuation of application No. 14/667,094, filed on Mar. 24, 2015, now Pat. No. 9,823,480, which is a continuation-in-part of application No. 13/686,974, filed on Nov. 28, 2012, now Pat. No. 9,104,029.

(60) Provisional application No. 61/972,305, filed on Mar. 29, 2014, provisional application No. 61/601,763, filed on Feb. 22, 2012.

(51) Int. Cl.
  G02B 19/00 (2006.01)
  H01S 5/40 (2006.01)
  G02B 27/42 (2006.01)
  G02B 26/02 (2006.01)
  H01S 5/14 (2006.01)

(52) U.S. Cl.
  CPC ..... *G02B 27/1086* (2013.01); *G02B 27/4244* (2013.01); *H01S 5/4062* (2013.01); *G02B 26/02* (2013.01); *H01S 5/141* (2013.01); *H01S 5/143* (2013.01); *H01S 5/4087* (2013.01); *Y10T 29/49895* (2015.01)

(58) Field of Classification Search
  USPC .......................................................... 359/634
  See application file for complete search history.

(56) References Cited

U.S. PATENT DOCUMENTS

| | | | |
|---|---|---|---|
| 5,356,576 A | 10/1994 | Fischbach | |
| 6,044,096 A | 3/2000 | Wolak et al. | |
| 6,192,062 B1 | 2/2001 | Sanchez-Rubio et al. | |
| 7,286,277 B2 | 10/2007 | Bibom et al. | |
| 7,336,907 B2 | 2/2008 | Powell et al. | |
| 7,948,680 B2 | 5/2011 | Goodno | |
| 7,974,534 B2 | 7/2011 | Weiner et al. | |
| 8,049,966 B2 | 11/2011 | Chann | |
| 8,553,327 B2 | 10/2013 | Kojima et al. | |
| 9,104,029 B2 | 8/2015 | Tayebati et al. | |
| 9,746,679 B2 | 8/2017 | Deutsch et al. | |
| 9,823,480 B2 | 11/2017 | Tayebati et al. | |
| 9,843,154 B2* | 12/2017 | Tayebati | H01S 3/0826 |
| 10,241,338 B2 | 3/2019 | Deutsch et al. | |
| 10,606,089 B2 | 3/2020 | Tayebati et al. | |
| 2003/0053066 A1 | 3/2003 | Redner | |
| 2004/0008401 A1 | 1/2004 | Szczepanek et al. | |
| 2004/0095983 A1 | 5/2004 | Whitley | |
| 2004/0174604 A1 | 9/2004 | Brown | |
| 2004/0252744 A1 | 12/2004 | Anikitchev et al. | |
| 2006/0098700 A1 | 5/2006 | Alahautala et al. | |
| 2006/0126690 A1 | 5/2006 | Kido et al. | |
| 2007/0002925 A1 | 1/2007 | Zediker | |
| 2007/0165624 A1 | 6/2007 | Volodin | |
| 2010/0110556 A1 | 5/2010 | Chann et al. | |
| 2011/0019710 A1 | 1/2011 | Strohmaier et al. | |
| 2011/0216792 A1 | 3/2011 | Bien et al. | |
| 2011/0122482 A1 | 5/2011 | Mead | |
| 2011/0216417 A1 | 9/2011 | Chann et al. | |
| 2011/0267671 A1 | 11/2011 | Peng et al. | |
| 2011/0310921 A1 | 12/2011 | Chann | |
| 2012/0002272 A1* | 1/2012 | Chann | H01S 5/4062 359/566 |
| 2012/0105968 A1 | 5/2012 | Chann et al. | |
| 2013/0215517 A1 | 8/2013 | Kayebati et al. | |
| 2015/0331245 A1 | 11/2015 | Tayebati et al. | |
| 2016/0161752 A1 | 6/2016 | Negoita et al. | |
| 2016/0268761 A1* | 9/2016 | Tayebati | H01S 3/08 |
| 2018/0039088 A1 | 2/2018 | Tayebati et al. | |

OTHER PUBLICATIONS

Schreiber P et al: "High-brightness fiber-coupling schemes for diode laser bars", Proceedings of the SPIE—The International Society for Optical Engineering SPIE—The International Society for Optical Engineering USA, vol. 5876, 2005, pp. 587602-1-587-602-10, XP002659944, ISSN: 0277-786X.

Chann, Bet al. "Frequency Narrowed External Cavity Diode Laser Array Bar" Optics Letters, vol. 25. No. 18 Sep. 15, 2000.

Gopinath, J_ T. et al., "1450nm High Brightness Wavelength Beam Combined Diode Laser Array" Optics Express, vol. 16, No. 13, Jun. 23, 2008.

Zhu, H. et al., "Spectrally Narrowed External-Cavity High-Power Stack of Laser Diode Arrays", Optics Letters, vol. 30, No. 11, Jun. 1, 2005.

Augst, Steven J_ et al., "Beam Combining of Ytterbium Fiber Amplifiers {Invited)," Journal of Optical Social America B., vol. 24, No. 8, Aug. 2007.

Bates, Harry et al., "Picosecond Pulse Stacking in Calcite," Applied Optics vol. 18, No. 7, Apr. 11, 1979.

Clarkson, W.A. et al., "Two-Mirror Beam-Shaping Technique for High-Power Diode Bars," Optics Letters, vol. 21, No. 5, Mar. 15, 1996.

Dawson. Jay W. et al., "Analysis of the Scalability of Diffraction-Limited Fiber Lasers and Amplifiers to High Average Power," Optics Express, vol. 16, No. 17, Aug. 18, 2008.

Fan, T.Y., "Laser Beam Combining for High-Power, High-Radiance Sources," IEEE Journal of Selected Topics in : Quantum Electronics, vol. 11, No. 3, May/Jun. 2005.

Loftus, Thomas H. et al., "Spectrally Beam-Combined Fiber Lasers for High-Average-Power Applications," IEEE Journal of Selected Topics in Quantum Electronics, vol. 13, No. 3, May/Jun. 2007.

* cited by examiner

WAVELENGTH BEAM COMBINING LASER SYSTEMS WITH MICRO-OPTICS

RELATED APPLICATIONS

This application is a continuation of U.S. patent application Ser. No. 15/789,092, filed Oct. 20, 2017, which is a continuation of U.S. patent application Ser. No. 14/667,094, filed Mar. 24, 2015, which claims the benefit of and priority to U.S. Provisional Patent Application No. 61/972,305, filed Mar. 29, 2014, the entire disclosure of each of which is hereby incorporated herein by reference. U.S. patent application Ser. No. 14/667,094, filed Mar. 24, 2015, is also a continuation-in-part of U.S. patent application Ser. No. 13/686,974, filed Nov. 28, 2012, which claims the benefit of and priority to U.S. Provisional Patent Application No. 61/601,763, filed Feb. 22, 2012, the entire disclosure of each of which is hereby incorporated herein by reference.

TECHNICAL FIELD

In various embodiments, the present invention relates to laser systems, specifically wavelength beam combining laser systems with various collimating and converging optics.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. The optical system is typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

Wavelength beam combining (WBC) is a technique for scaling the output power and brightness from laser diode bars, stacks of diode bars, or other lasers arranged in one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

While a variety of WBC techniques have been utilized to form high-power lasers for a host of different applications, many such techniques involve complicated arrangements of optical elements for beam manipulation, and, depending on the locations of the various optical elements in the optical train of the system, it may be difficult to obtain the desired beam quality factor of the final combined beam and/or to maintain a relatively small overall footprint of the laser system. Thus, there is a need for improved WBC systems and techniques of combining the outputs of different laser emitters into an output beam having a high beam quality factor (i.e., a beam quality factor as close to unity as possible) and that result in relatively compact laser systems.

SUMMARY

In accordance with embodiments of the present invention, wavelength beam combining laser systems feature multiple emitters (or "beam emitters"), e.g., diode bars or the individual diode emitters of a diode bar, which are combined using a dispersive element to form a multi-wavelength beam. Each emitter in the system individually resonates and is stabilized through wavelength-specific feedback from a common partially reflecting output coupler that is filtered by the dispersive element (e.g., a diffraction grating, a dispersive prism, a grism (prism/grating), a transmission grating, or an Echelle grating) along the beam-combining dimension. In this manner, laser systems in accordance with embodiments of the present invention produce multi-wavelength output beams having high brightness and high power.

In accordance with various embodiments of the present invention, the laser system features individual micro-optics arrangements each placed immediately downstream from an emitter of an individual (i.e., single) beam. (Herein, "downstream" or "optically downstream," is utilized to indicate the relative placement of a second element that a light beam strikes after encountering a first element, the first element being "upstream," or "optically upstream" of the second element.) Each arrangement of micro-optics may include or consist essentially of, for example, a fast-axis collimation (FAC) lens, a beam rotator (or "optical rotator," or "beam twister," or "optical twister") downstream of the FAC lens, and slow-axis collimation (SAC) lens downstream of the beam rotator. The individual arrangements of micro-optics may be advantageously utilized to bend or converge the individual beams toward a dispersive element such as a diffraction grating, from which the beams are dispersed and subsequently combined into the multi-wavelength output beam. The micro-optics arrangements may converge each of the beams toward the dispersive element at an angle of rotation (selected by, e.g., the beam rotator) different from the other beams. This rotational difference advantageously at least partially converges the individual beams even before they are focused onto the dispersive element by a focusing lens (or "combining optical element" or "combining lens," e.g., one or more cylindrical lenses and/or mirrors, and/or one or more spherical lenses and/or mirrors), thereby enabling the various components to be arranged closer together to facilitate a more compact system. For example, the focusing lens and the diffraction grating may be disposed at an optical distance (i.e., the distance traveled by a light beam propagating from one element to another, which may or may not be approximately equal to a physical spacing between the elements) that is less than the focal length of the focusing lens. The "pre-convergence" enabled by the individual micro-optics arrangements may also enable the focusing lens to include or consist essentially of a spherical lens, which may be less complex and less costly than other focusing-lens solutions.

In various embodiments of the present invention, additional lenses and/or other optical elements are placed optically downstream from the dispersive element (and preferably optically upstream of the partially reflective output coupler) in order to reduce or substantially eliminate cross-coupling of feedback in the system. The partially-reflective output coupler transmits the multi-wavelength output beam and reflects a portion thereof back into the system (and to the individual emitters) to ensure unique wavelength stabilization of each emitter.

Embodiments of the present invention may also reduce the footprint of the laser system, increase output power of the output beam, and/or enable the brightness of the output beam to be adjusted (e.g., in real time and/or via feedback control). Through the various embodiments and techniques described herein a reduced-size, stabilized, variable brightness multi-wavelength output laser system may be achieved.

The approaches and embodiments described herein may apply to one- and two-dimensional beam combining systems along the slow-axis, fast-axis, or other beam combining dimension. In addition, the techniques may apply to external and non-external cavity wavelength beam combining systems.

Embodiments of the present invention may be utilized to couple the one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, vertical cavity surface emitting lasers (VCSELs), etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams (i.e., each diode in the bar emits a single beam).

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 μm×100 μm. The beam quality along the 1 μm dimension or fast-axis is typically diffraction-limited. The beam quality along the 100 μm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

In an aspect, embodiments of the invention feature a laser system that includes or consists essentially of a plurality of beam emitters, a plurality of micro-optics arrangements, focusing optics, a dispersive element, and a partially reflective output coupler. Each beam emitter emits an individual beam and may include or consist essentially of a diode emitter. The plurality of beam emitters may include or consist essentially of a diode bar or a group of multiple diode bars. Each micro-optic arrangement is disposed optically downstream from a beam emitter to (i) intercept the beam emitted thereby, (ii) rotate (and/or converge, e.g., toward the other beams) the beam, and (iii) direct the beam toward the dispersive element. The focusing optics have a focal length. The focusing optics are disposed optically downstream from the plurality of micro-optics arrangements. The rotated (and/or converged) beams are, via the focusing optics, directed toward, converged toward, focused on, and/or overlapped on the dispersive element. The dispersive element receives and disperses the beams downstream from the focusing optics. The partially reflective output coupler receives the dispersed beams, reflects a first portion thereof back toward the dispersive element, and transmits a second portion thereof as a multi-wavelength output beam. The optical distance between the focusing optics and the dispersive element may be less than the focal length. Each micro-optics arrangement may rotate its corresponding beam by a different angle.

Embodiments of the invention may include one or more of the following in any of a variety of combinations. Each micro-optics arrangement may be disposed proximate (or even in contact with) the beam emitter (e.g., the front facet thereof) emitting the beam intercepted by the micro-optics arrangement. The dispersive element may include or consist essentially of a diffraction grating (e.g., a reflective diffraction grating and/or a transmissive diffraction grating). The focusing optics may include or consist essentially of one or more spherical lenses. The optical distance between (i) the plurality of beam emitters and/or the plurality of micro-optics arrangements and (ii) the focusing optics may be approximately equal to the focal length. Each micro-optics arrangement may include or consist essentially of a fast-axis collimation lens, an optical rotator, and a slow-axis collimation lens. The optical rotator may be disposed (i) optically downstream from the fast-axis collimation lens and/or (ii) optically upstream from the slow-axis collimation lens. In each micro-optics arrangement, one or more of the fast-axis collimation lens, the optical rotator, and the slow-axis collimation lens may be disposed in contact with each other or be portions of a single unified component having the functionality thereof. The laser system may include a cross-talk mitigation system disposed (i) optically downstream from the dispersive element and/or (ii) optically upstream from the partially reflective output coupler. The cross-talk mitigation system may include or consist essentially of a plurality of lenses (e.g., spherical lenses). The cross-talk mitigation system may include or consist essentially of (i) a first lens having a first focal length, and (ii) a second lens, disposed optically downstream from the first lens, having a second focal length. The ratio of the first focal length to the second focal length may be two or greater. The optical distance between the first and second lenses may be approximately equal to the sum of the first and second focal lengths.

In another aspect, embodiments of the invention feature a laser system than includes or consists essentially of a plurality of beam emitters, a plurality of micro-optics arrangements, focusing optics, a dispersive element, and a partially reflective output coupler. The laser system may also include a cross-talk mitigation system, which may be disposed (i) optically downstream from the dispersive element and/or (ii) optically upstream from the partially reflective output coupler. Each beam emitter emits an individual beam. Each micro-optic arrangement is disposed optically downstream from a beam emitter to (a) intercept the beam emitted thereby, and (b) direct the beam toward a dispersive element. Each micro-optic arrangement includes or consists essentially of a fast-axis collimation lens, an optical rotator, and a slow-axis collimation lens. The focusing optics have a focal length. The focusing optics are disposed optically downstream from the plurality of micro-optics arrangements. The beams are, via the focusing optics, directed toward, converged toward, focused on, and/or overlapped on the dispersive element. The dispersive element receives and disperses the beams downstream from the focusing optics. The partially reflective output coupler receives the dispersed beams, reflects a first portion thereof back toward the dispersive element, and transmits a second portion thereof as a multi-wavelength output beam.

Embodiments of the invention may include one or more of the following in any of a variety of combinations. The optical distance between the focusing optics and the dispersive element may be less than the focal length. Each micro-optics arrangement may be disposed proximate (or even in contact with) the beam emitter (e.g., the front facet thereof) emitting the beam intercepted by the micro-optics arrangement. The dispersive element may include or consist essentially of a diffraction grating (e.g., a reflective diffraction grating and/or a transmissive diffraction grating). The focusing optics may include or consist essentially of one or more spherical lenses. The optical distance between (i) the plurality of beam emitters and/or the plurality of micro-optics arrangements and (ii) the focusing optics may be approximately equal to the focal length. In each micro-optics arrangement, the optical rotator may be disposed (i) optically downstream from the fast-axis collimation lens and/or (ii) optically upstream from the slow-axis collimation lens. In each micro-optics arrangement, one or more of the fast-axis collimation lens, the optical rotator, and the slow-axis collimation lens may be disposed in contact with each other or be portions of a single unified component having the functionality thereof. The cross-talk mitigation system may include or consist essentially of a plurality of lenses (e.g., spherical lenses). The cross-talk mitigation system may include or consist essentially of (i) a first lens having a first focal length, and (ii) a second lens, disposed optically downstream from the first lens, having a second focal length. The ratio of the first focal length to the second focal length may be two or greater. The optical distance between the first and second lenses may be approximately equal to the sum of the first and second focal lengths.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
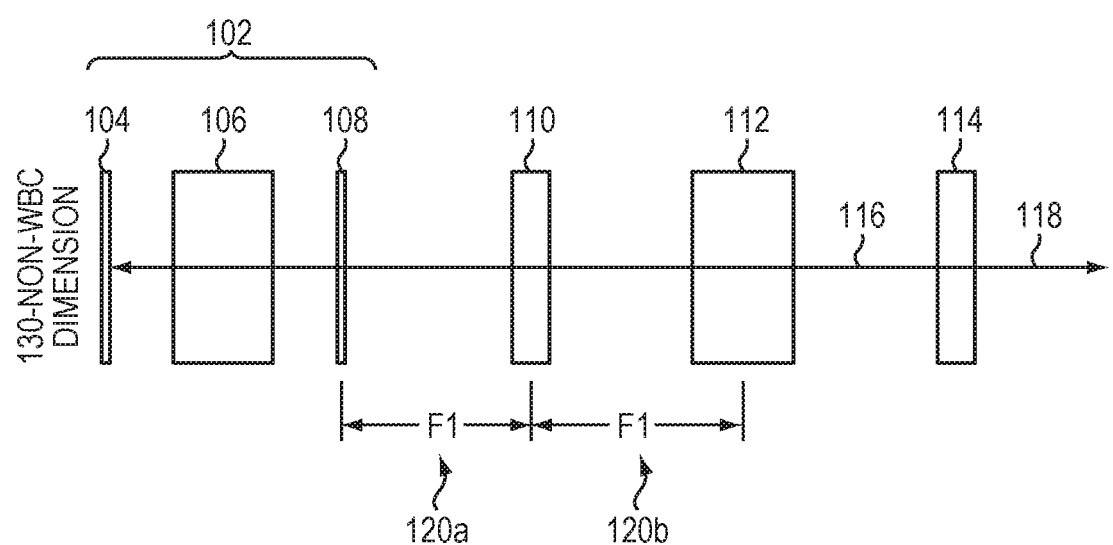
FIG. 1A is a schematic illustration of a conventional wavelength beam combining (WBC) laser system along a non-beam-combining dimension.
Figure 1B:
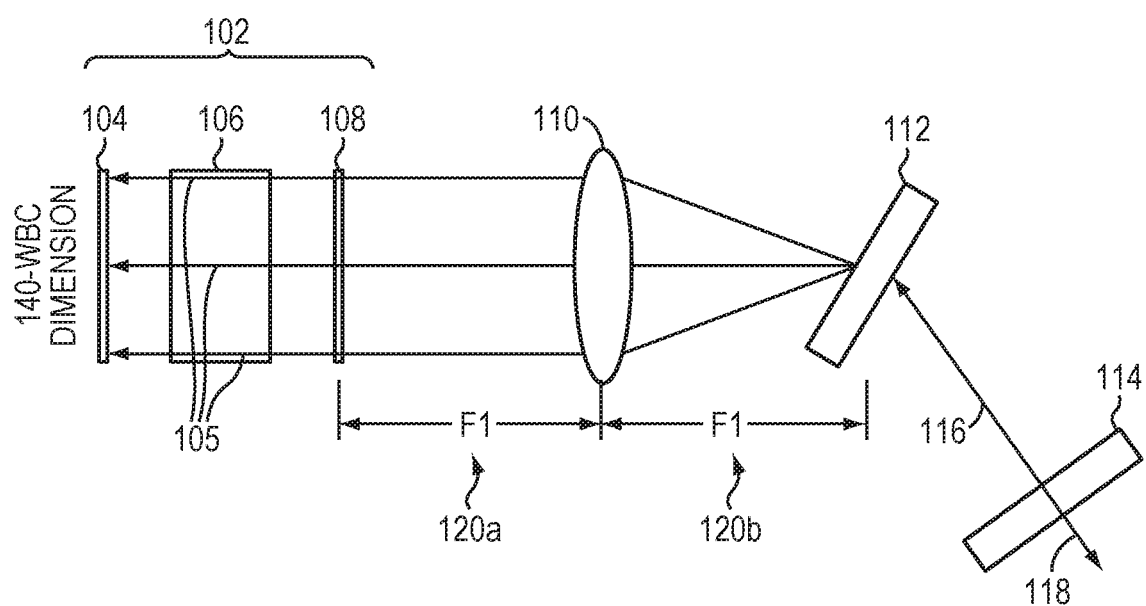
FIG. 1B is a schematic illustration of the WBC laser system of FIG. 1A along the beam-combining dimension.

FIGS. 1A and 1B illustrate a conventional external-cavity one-dimensional wavelength beam combining (WBC) laser system along a non-beam-combining dimension 130 (FIG. 1A) and along a beam-combining dimension 140 (FIG. 1B). As shown, such systems may include a one-dimensional diode bar 102 having a back reflective surface 104, a gain medium 106 with two or more diode emitters 105, a front reflective surface 108, a combining optic (or "focusing lens") 110, a dispersive element 112, and a partially reflecting output coupler 114. The combining optic 110 is typically placed an optical distance 120a away from the front reflective surface 108 of the diode bar 102, while the dispersive element 112 is placed an optical distance 120b away from combining optic 110, where both optical distances 120a, 120b are substantially equal to the focal length of the combining optic 110. The output coupler 114 is spaced away from the dispersive element 112 and reflects a portion 116 of the generated beams (feedback) to the dispersive element 112 and transmits a multi-wavelength output beam 118 that includes the wavelengths emitted by the various emitters 105. The combining lens 110 is typically placed to accomplish two functions. The first function is to overlap all the chief rays from all the diode elements onto the dispersive element 112. The second function is to collimate each beam in both axes.

Figure 2A:
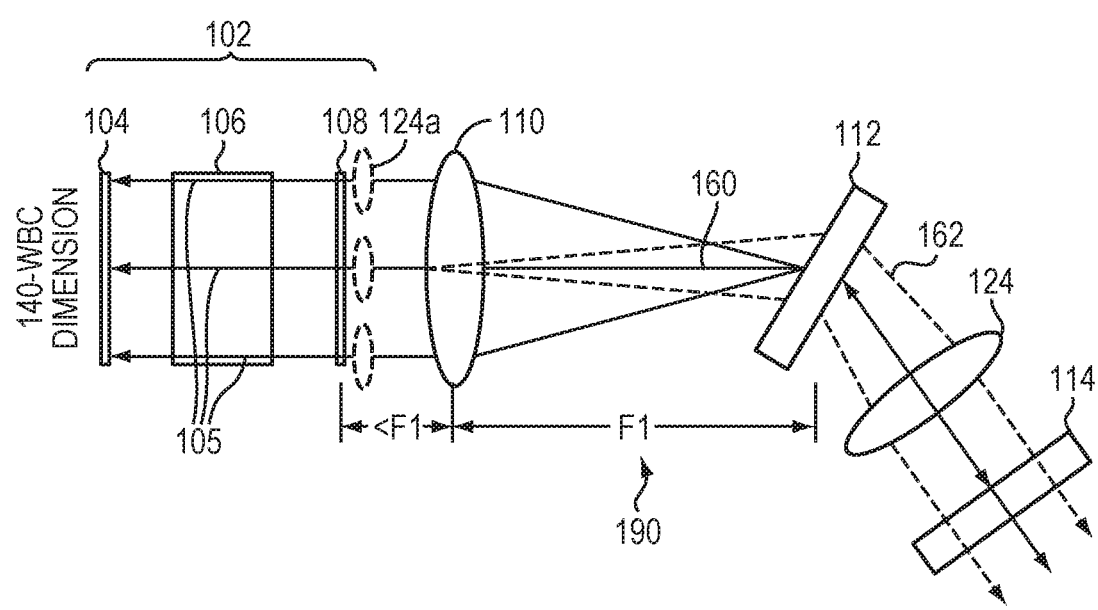
FIGS. 2A-2C are schematic illustrations of WBC laser systems with non-confocal focusing optics in accordance with embodiments of the invention.
Figure 2B:
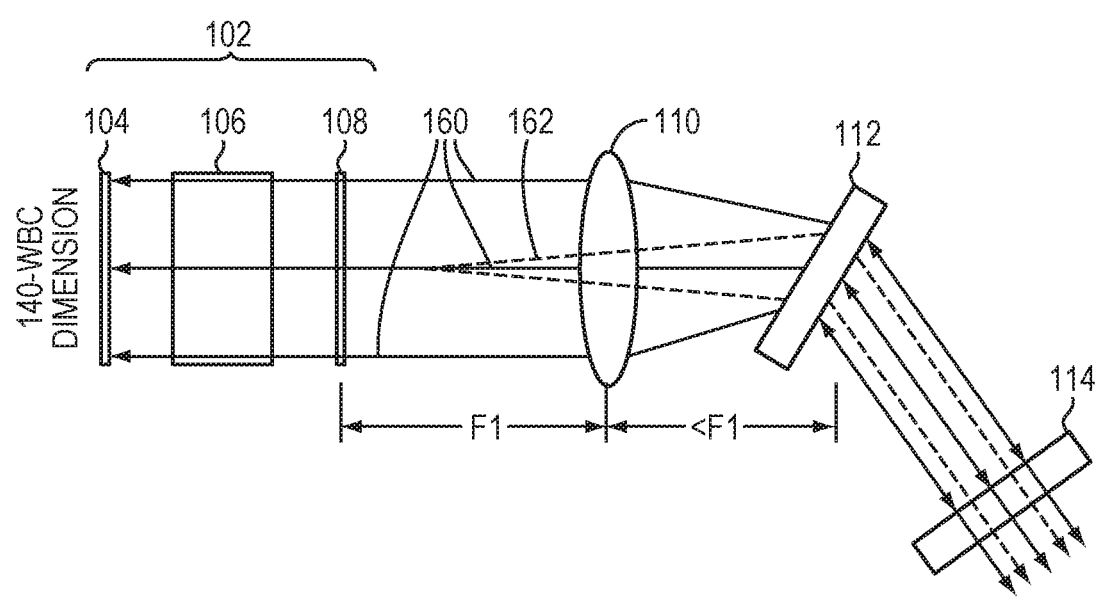

However, more compact WBC systems, such as those shown in FIGS. 2A and 2B, may be achieved by intentionally placing the diode bar 102 or dispersive element 112 at a position other than the focal plane of the combining optical element 110. If the combining optical element 110 is placed less than a focal length from the diode bar 102, than an additional collimating optic(s) 124 may be placed before or after the dispersive element 112 and before the partially reflective output coupler 114 as shown in FIG. 2A. This allows the optical path length between the diode bar and output coupler to be reduced by almost (or substantially) a full focal length of combining element 110, for example when combining element 110 is placed adjacent to the front surface/facet 108 of diode bar 102.

In a variation of this embodiment, collimating optic(s) 124a may be individually placed in front of each emission point along the front surface/facet of the diode bar and before the combining optical element 110, which still results in a more compact WBC system. In this variation, the collimating optic(s) 124a may include or consist essentially of an array of micro-optical fast-axis collimating (FAC) lenses, slow-axis collimating lenses (SAC) or combination of both. Collimating each beam helps to ensure that proper wavelength stabilization feedback is received into each of the diode elements. This helps each diode element produce a unique wavelength that is stabilized and less susceptible to shifting, and thus a multi-wavelength output beam profile of high brightness and high power may be achieved.

As shown in FIG. 2A, the dispersive element (e.g., a diffraction grating) is placed substantially at the back focal plane of the focusing lens. As shown, to a first approximation, the lens with focal length 190 only converges the chief rays for each of the diode elements. This may be understood from the Gaussian beam transformation by a lens equation $1/(s+z_r^2/(s-f))+1/s''=1/f$, where s and s'' are the input and output waist locations, zr is the Raleigh range, and f is the focal length. Thus, the chief rays 160 are overlapping at the grating while each beam is still diverging and thus forming diverging rays (shown as dashed lines). The diverging rays may or may not be later collimated by an optical element, such as optical element 124. With all the diode element beams overlapped on the dispersive element 112, the output beam quality is generally that of a single emitter. Again, one advantage of this system is that the size may be considerably smaller, as it does not require an optical spacing between diode elements and the dispersive element equal to twice the focal length of the lens 110. In some embodiments, the beam path is reduced by almost half or more. The spacing between various elements as described herein may be slightly longer, equal to, or slightly shorter than the focal length 190.

Alternatively, an embodiment devoid of collimating optic(s) 124 is illustrated in FIG. 2B. Combining optical element 110 is placed a focal length from the front facet 108 and as a result collimates the light from each diode element. A reduced system size is still achieved by placing dispersive element 112 less than a focal length from combining optical element 110. The brightness of the multi-wavelength beam is still increased as compared to the initial array of beams produced by diode bar 102.

As shown in FIG. 2B, the dispersive element 112, is placed much closer than the back focal plane. However, the penalty of such a system is there is some degradation in the output beam quality. To further illustrate, in one variation of this embodiment, it is assumed that the diode elements 102 are a single 10-mm wide bar with 47 emitters. Each emitter may have a FAC lens (not shown) and no SAC lens. Inclusion of a SAC lens does not change the exemplary results detailed here. The focal length of the FAC lens in this variation is 910 μm. In this variation, the diode bar is operating at a 1 μm wavelength. With each beam being diffraction limited along the fast axis, the typical full divergence after the FAC lens is about 1 milliradian (mrd). Along the slow-axis the beam is diverging about 100 mrd. We assume that the combining optical element 110 or transform lens has a focal length of 150 mm. The output beam quality is approximately $M^2=(\theta \times \pi/(4\times\pi))\times sqrt((z\times x/f)^2+1)$, where λ=1 μm, z is the distance after the lens to the grating and center at the back focal plane, x is the dimension of the array (e.g., 10 mm), and θ is the individual beam divergence after the grating.

Figure 6:
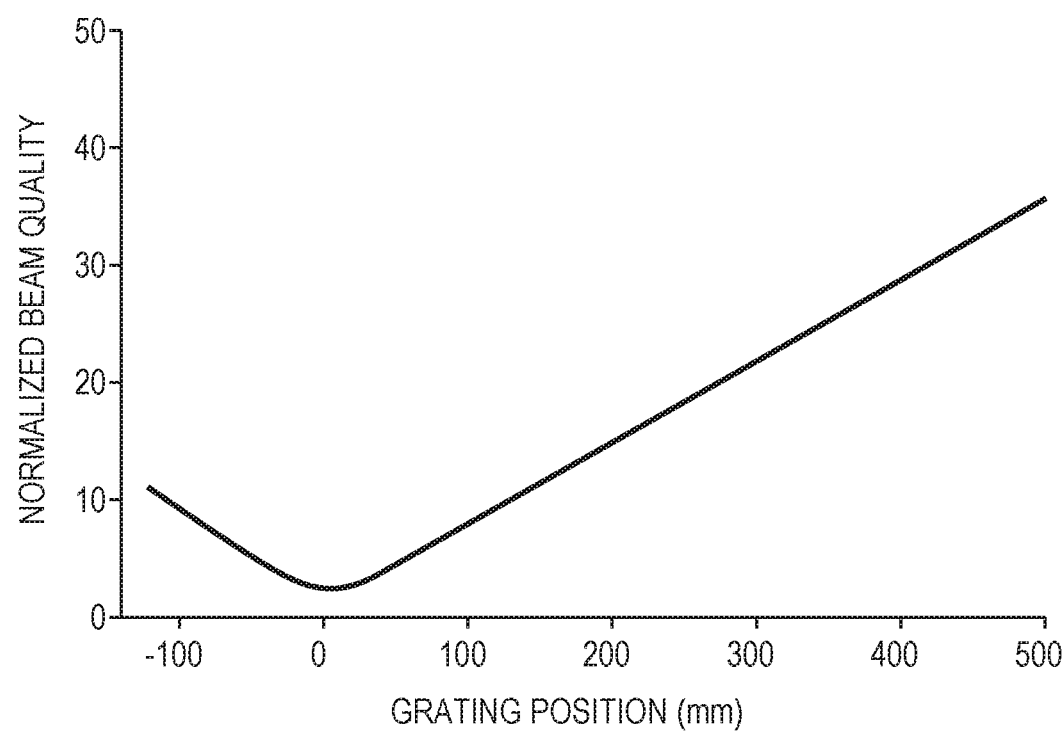
FIG. 6 is a graph of normalized beam quality as a function of the position of the dispersive element for an exemplary WBC laser system of FIG. 2B in accordance with embodiments of the invention.

FIG. 6 is a graph illustrating the approximate output beam quality as a function of grating position. The output beam quality is normalized to the ideal case where the grating is at the back focal plane of the optics. As expected at z=0 or the back focal plane the normalized beam quality is 1 and grows to about 33 times at z=500. The normalized free-running beam quality is about $M^2 \sim 47/ff=47/0.5=94$, where ff is the near field fill-factor of the diode emitter. Thus, even at z=500, the beam quality of the system is still better than free a running system, one without WBC, by about three times. In FIGS. 1A and 1B, the combining element 110 also acted as the collimating element. In FIG. 2A the function of the combining element 110 is primarily to focus the chief rays 160 onto the dispersive element 112 and an additional collimating element 124 is placed after the dispersive element 112 generally at the focal plane of 124 to collimate the diverging rays 162. In FIG. 2B, combining element 110 is placed at approximately a focal length from the front aperture 108 and collimates the diverging rays, but because of the shortened distance from combining element 110 to dispersive element 112, the chief rays do not completely overlap onto each other as in typical conventional WBC arrangements. The multi-beam output still has an increase in brightness, but as suggested by FIG. 6 is not at optimal brightness.

Figure 2C:
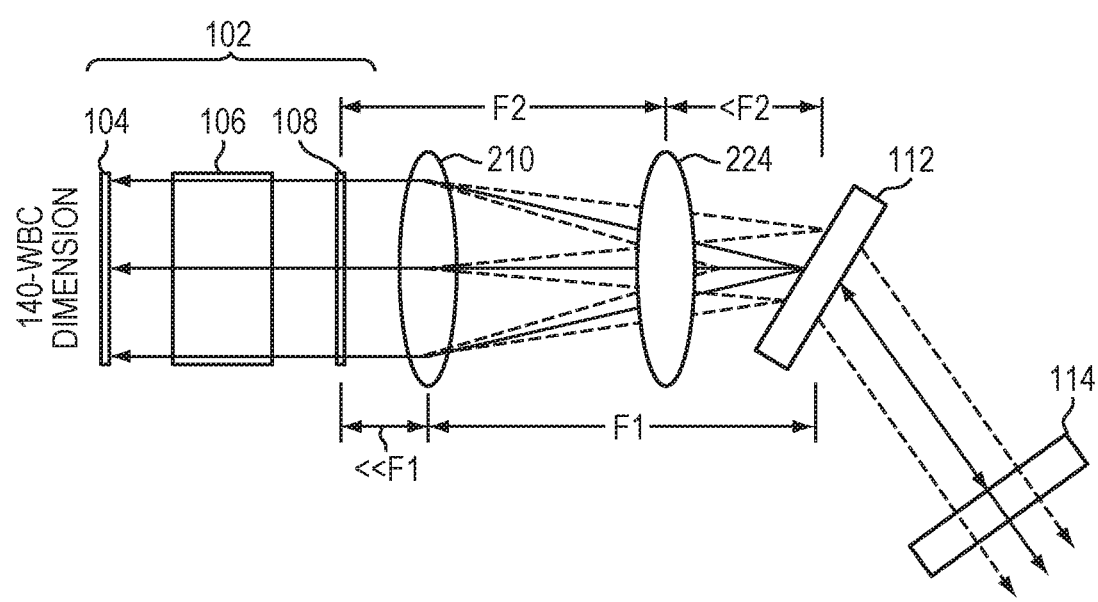

FIG. 2C illustrates a WBC system that enables a shortened beam pathway and substantially separates the functionality of combining chief rays and collimating diverging rays into two separate optical elements (or systems) positioned before the dispersive element. A combining element 210 is positioned at a distance substantially less than its respective focal length F1 away from the front aperture 108 on one side and approximately a focal length F1 away from the dispersive element 112 on the other side. This allows combining element 210 to direct the chief rays from each diode emitter of diode bar 102 to overlap or substantially overlap on the dispersive element 112. At the same time, a collimating optical element 224 is placed approximately a focal distance F2 away from the front aperture of each diode emitter on one side and at a distance less than focal length F2 from the dispersive element on the other side. Similarly, the primary function of the collimating optical element 224 is to collimate the diverging rays. One skilled in the art will readily acknowledge that both optical elements 210, 224 have optical power along the same dimension and as a result will have some effect on the actual placement of each optical element with respect to the front aperture and dispersive element. However, this interdependency is managed in-part by the placement of each optical element substantially close to the front aperture on one side and the dispersive element on the other side. Thus, the combining optical element 210 primarily dominates the combining of the chief rays on the dispersive element 112, but is influenced by the prescription of collimating optical element 224 and vice versa.

Figure 3:
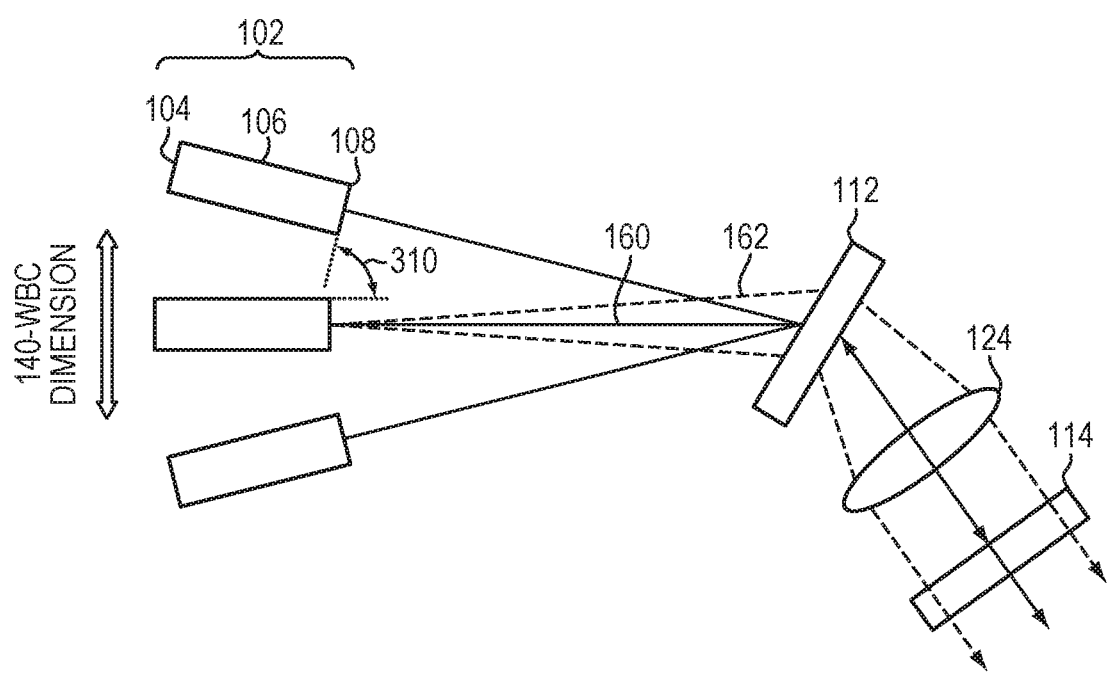
FIG. 3 is a schematic illustration of a WBC laser system lacking focusing optics upstream of the dispersive element in accordance with embodiments of the invention.

Other embodiments described herein also reduce system size and even the need for an optical combining element(s) through using alternative position-to-angle methods. For example, FIG. 3 illustrates a WBC system devoid of an optical combining element. Each diode bar 102 (which in some cases may include or consist essentially of only a single diode emitter) may be mechanically positioned in a manner that the chief rays 160 exiting the diode bars 102 overlap at a common region on the dispersive element 112 as shown. (In other variations of this embodiment, and similar to FIG. 2B, the beams do not completely overlap at the dispersive element, but the spatial distance between each along a combining dimension is reduced.) The diverging rays 162 (dashed lines), are later collimated by collimating optic(s) 124 positioned between the dispersive element 112 and the partially reflective output coupler 114. (Some variations of this embodiment include replacing collimating optic 124 with individual FAC and/or SAC lenses positioned at the front surface or facet of each diode bar.) This embodiment thus increases brightness while reducing the number of optical elements required as well as reducing overall system size.

Figure 4:
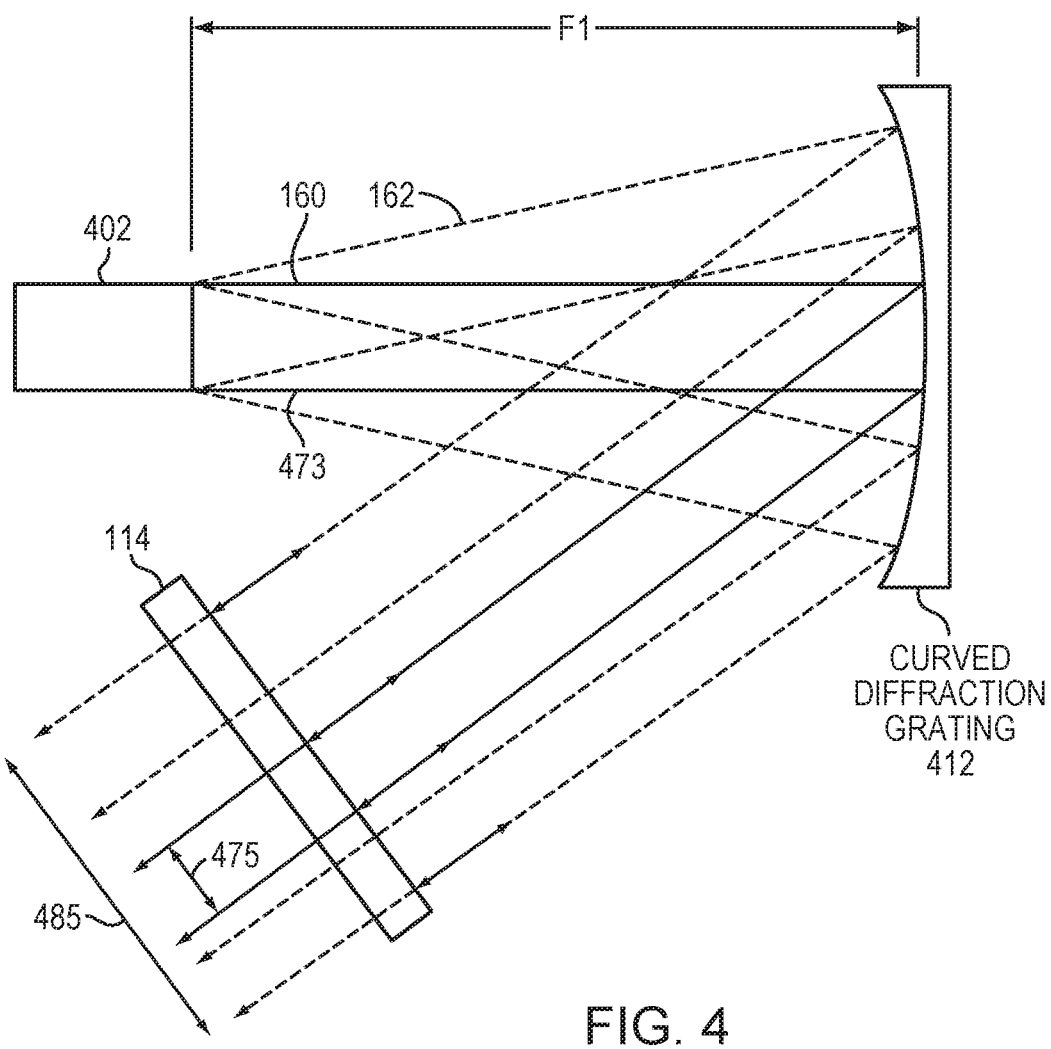
FIG. 4 is a schematic illustration of a WBC laser system utilizing a curved dispersive element in accordance with embodiments of the invention.

In another embodiment shown in FIG. 4, a curved diffraction grating 412 is placed a focal length F1 from the diode bar 102. The curved diffraction grating combines the emitted beams into a multi-wavelength beam that is transmitted to the partially-reflective output coupler 114, where a portion is reflected back towards the curved diffraction grating 412. The wavelengths of the reflected beams are then filtered by the diffraction grating and transmitted back into each emitter of diode bar 102, where each emitter is stabilized to a particular wavelength. The limitation of brightness in this type of system generally hinges on the amount of power the curved diffraction grating can handle. This embodiment illustrates an optical architecture reducing the number of optical elements and shortening the beam path while increasing the brightness of a multi-wavelength output beam. Any degradation of the beam quality results as a function of the width 475 over the entire distance of the beam profile 485.

Figure 5A:
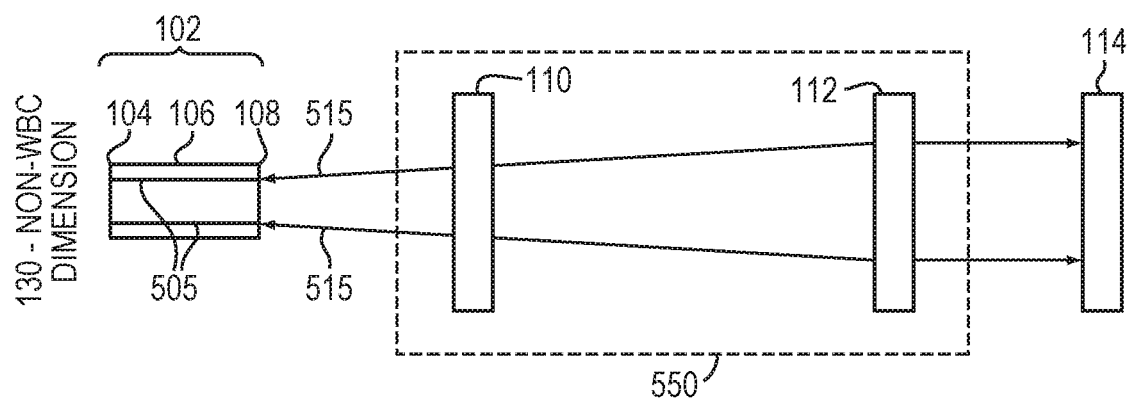
FIGS. 5A-5C are schematic illustrations of WBC laser systems incorporating spatial combining optical systems configured to substantially overlap wavelength feedback along a non-beam-combining dimension in accordance with embodiments of the invention.
Figure 5B:
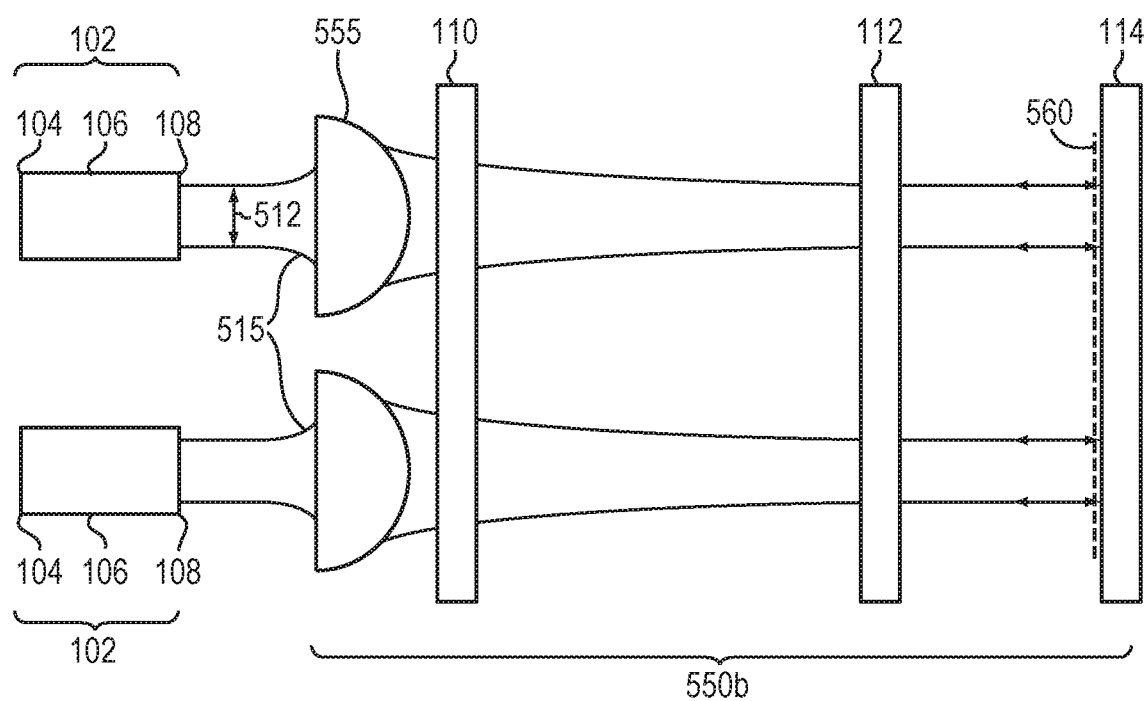
Figure 5C:
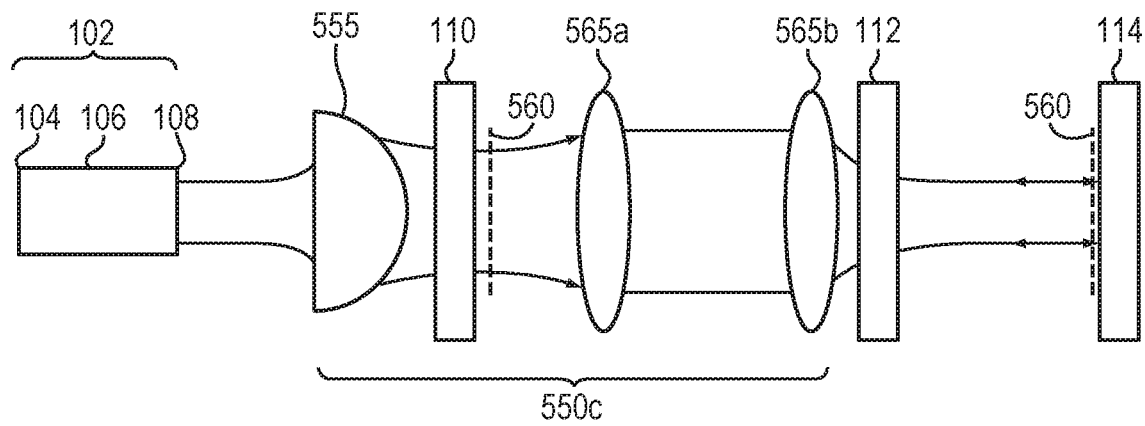
Figure 7A:
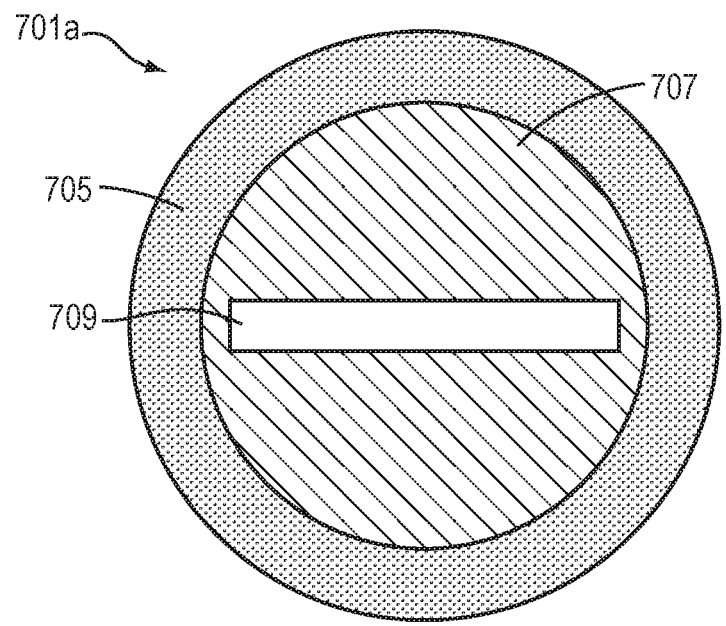
FIGS. 7A and 7B are schematic illustrations of beams from WBC systems in-coupled into optical fibers in accordance with embodiments of the invention.
Figure 7B:
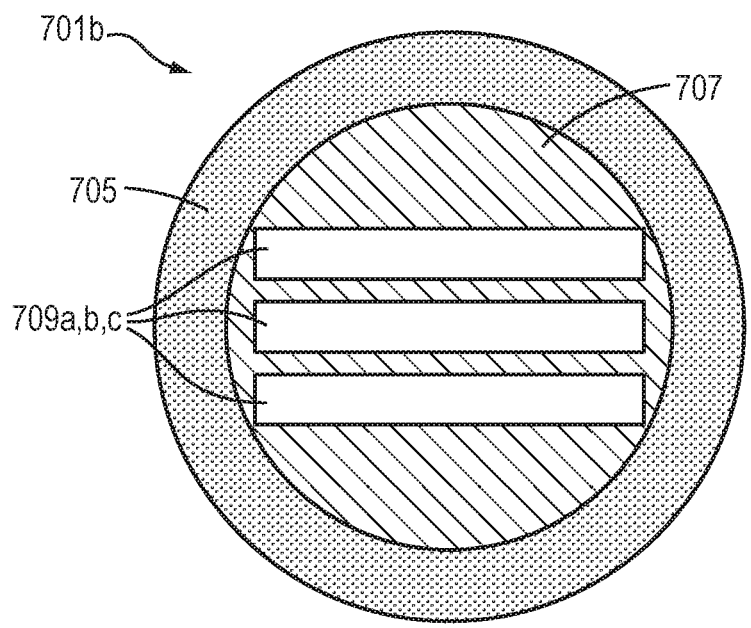

FIGS. 5A-5C illustrate various embodiments of spatial combiners incorporated along the non-beam combining dimension 130 of a WBC system that help to increase the amount of system output power that may be coupled into a fiber (e.g., as illustrated in FIGS. 7A and 7B). FIG. 5A illustrates a simple black box model, showing a spatial combiner 550 that may be configured in various ways. The key concepts are to overlap feedback for each beam along its original pathway along the non-combining dimension to be received back into each of the original emission points or emitters. The feedback is often the result of the partially-reflective output coupler 114, which reflects a portion of the multi-wavelength beams. For example, two optical pathways 515, as shown in FIG. 5A, are where beams or multiple beams of radiation travel through the spatial combiner 550, which helps to overlap the radiation reflected by output coupler 114, back into the emitters 505, thus forming a stabilized system.

FIG. 5B illustrates one embodiment of a system utilizing a spatial combiner in which multiple lenses 555 image the beam waist of each emitter (or array of emitters) from each diode bar 102 onto or near the partially-reflective output coupler 114. This helps the two-dimensional array of emitters (here shown as two diode bars having at least one emitter each) from diverging too quickly, properly guiding feedback into the original emitters, thus stabilizing each emitter along the non-beam combining dimension and allowing the multi-wavelength output to be in a compact form. FIG. 5C illustrates an embodiment having a spatial combiner 550c that uses a lens 555 and an afocal telescoping system (565a, 565b) to keep the reflected beams overlapping the original pathways and thus stabilizing each of the emitters.

FIGS. 7A and 7B illustrate an effect of spatial beam combining on fiber coupling. As shown in FIG. 7A, an optical fiber 701a has a cladding 705 and core 707 configured to receive a multi-wavelength beam 709. Multi-wavelength beam 709 is usually formed by combining single row (one dimension) of diode emitters (often generated by a single diode bar) into the size of a single element configured to be received by the core 707. However, in two-dimensional or multi-row/array diode emitters configurations (which may include, e.g., multiple diode bars) a spatial combiner, such as those described in FIGS. 5A-5C, may be used to configure a multi-wavelength beam profile that has the size of three original elements/emitters stacked in a single column three into a similar sized core 707 of an optical fiber 701b. For example, one bar may include or consist essentially of 49 emitters that are reduced to approximately the size of one emitter. Stacking or arranging optically or mechanically three bars with 49 emitters each a profile 709a,b,c (709a, b and c each representing a row or diode bar) may produce a multi-wavelength beam configured to be received into an optical fiber that increases the brightness and power by a factor of three times.

As described above, various spacing between the diode emitters, combining optical element and dispersive element have been discussed (including those systems devoid of an optical combining element). Also disclosed in FIG. 6 was a graph illustrating the normalized beam quality measured in terms of beam parameter product (BPP). The BPP of each system described herein may adjusted from a low BPP to a higher BPP. In laser manufacturing, cutting, and welding, various materials, thickness, type of cuts, etc. may require a laser to have a flexible output based on BPP. Some materials require the highest quality beam output (or lowest BPP available) to cut; however, in other circumstances where the parameters of the material, cut, and/or thickness have been altered, the same high quality may be insufficient to efficiently perform the desired task. Thus, the WBC system may be intentionally adjusted to reduce beam quality in order to more effectively accomplish a particular manufacturing task. Therefore, in embodiments of the invention, adjustable positioning of diode emitters with respect to the dispersive element, diode emitters with respect to the combining optical element, combining optical element with respect to the dispersive element, help to create a flexible WBC laser system that may accomplish a greater range of tasks. These adjustable position configurations may include manual and real-time adjustments, e.g., thin metal applications and thick metal applications, as well as the type of metal to be cut, which sometimes require different cutting parameters relative to beam quality. In another embodiment, in addition to linearly positioning the beams and elements along the beam combining dimension, the angular position of at least one of the beams is repositionable. This repositioning may be automated that it may occur in real time. One way of accomplishing this is by placing a rotatable optical element, such as a piece of glass, after the multi-wavelength output of the WBC system and prior to a fiber optical mount (FOM).

Figure 8A:
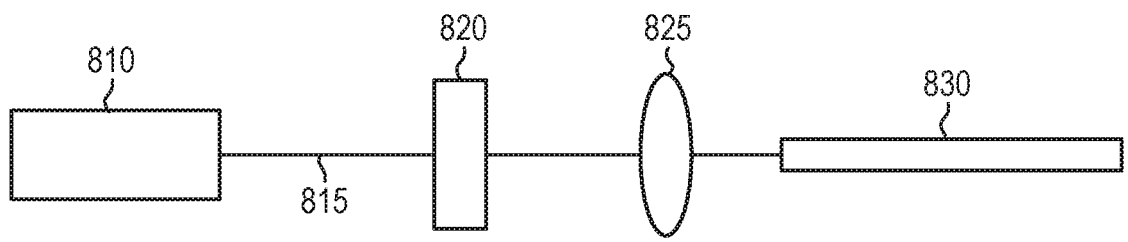
FIGS. 8A and 8B are schematic illustrations of beams from WBC systems being coupled into optical fibers with adjustable and/or variable beam quality in accordance with embodiments of the invention.
Figure 8B:
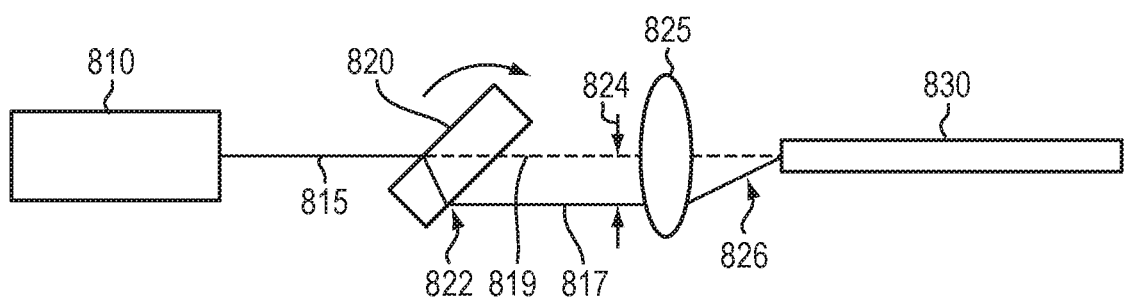

FIGS. 8A and 8B illustrate an embodiment incorporating a rotatable optical element 820 (or beam path adjuster) in the optical pathway 815 containing the multi-wavelength output beam from WBC system 810 to a FOM 825 configured to direct the multi-wavelength beam into fiber 830 with its associated numerical aperture (NA) and width. FIG. 8A illustrates a configuration in which the rotatable optical element 820 has a surface normal to the optical pathway 815, thus allowing the optical pathway to continue on to the FOM 825 with no or minimal interference. Alternatively, rotatable optical element 820 may be positioned so that the surface is offset at a non-normal angle, causing the multi-wavelength beam to be redirected to a point 822 and thus follow a new optical path 817 that is offset by a distance 824 from an unaltered optical pathway 819. This causes an angle 826 at which the multi-wavelength beam enters fiber 830 from FOM 825 to increase. This increase in angle reduces the quality of the multi-wavelength beam (i.e., increases its BPP). As stated, in some instances a less bright beam is actually more desirable for particular applications, thus having a tunable or adjustable WBC system may be configured to accomplish various tasks at optimal settings for those particular tasks. In some embodiments, the rotatable optical element 820 may be manually adjusted while in others the rotation process may be automated. In yet other configurations in which the output beam quality of the system is adjustable, the output power of each emitter may adjusted from completely off to full power output.

Figures 9A, 9B:
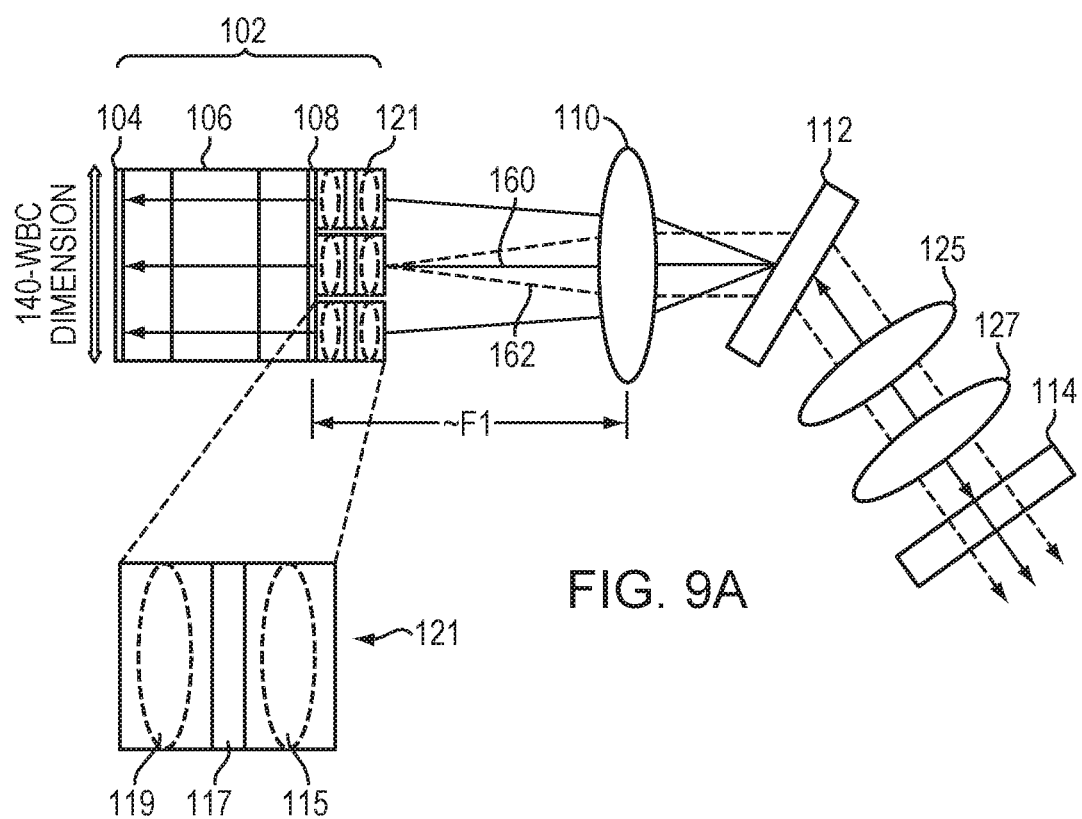
FIG. 9A is a schematic illustration of a WBC laser system incorporating individual micro-optic arrangements to collimate, rotate, and/or focus each individual beam being combined in accordance with embodiments of the invention.
FIG. 9B is a magnified view of one of the individual micro-optic arrangements of FIG. 9A.

FIGS. 9A and 9B illustrate a WBC system in accordance with embodiments of the present invention that utilizes micro-optic arrangements 121 to cause the beams emitted by each emitter in a diode bar 102 to converge toward the dispersive element 112. The focusing lens 110 causes each of the chief rays of the converging beams to overlap onto the dispersive element 112. The focusing lens 110 may be placed at a distance approximately equal to the focal length of focusing lens 110 away from the front facet of diode bar 102. As shown in FIG. 9A, the focusing lens 110 may be spaced away from the dispersive element 112 by a distance less than the focal length to, e.g., reduce the footprint of the WBC system. The micro-optics arrangements 121 may converge each of the beams toward the dispersive element 112 at an angle different from the other beams. This angular difference advantageously at least partially converges the individual beams even before they are focused onto the dispersive element by the focusing lens 110, thereby enabling the various components to be arranged closer together to facilitate a more compact system, as mentioned above. The "pre-convergence" enabled by the individual micro-optics arrangements 121 may also enable the focusing lens 110 to include or consist essentially of a spherical lens, which may be less complex and less costly than other focusing-lens solutions.

The micro-optics arrangements 121 may include or consist essentially of, for example, a FAC lens 119, an optical twister 117, and a SAC lens 115. The optical twister 117 may include or consist essentially of, e.g., two spaced-apart cylindrical lenses rotationally offset from each other. As mentioned above, rather than manipulating the individual beams as a group and thus rotating them substantially the same amount, the individual micro-optics arrangements 121 may be utilized to actually cause the beams to bend or converge individually towards the dispersive element 112—one or more of the beams (or even each beam) may be converged at a different angle from the others. The beams are combined at the dispersive element 112.

The dispersed beams may subsequently propagate through a cross-coupling mitigation system, which in various embodiments includes or consists essentially of optical elements 125 and 127. The distance between optical elements 125 and 127 may be exactly or approximately the sum of their focal lengths F125 and F127. In various embodiments, the ratio of the focal lengths of optical element 125 and optical element 127 (i.e., F125/F127) is at least two or greater. The partially reflective output coupler 114 is typically disposed downstream of the cross-coupling mitigation system. Advantageously, embodiments of the invention with the individual micro-element arrangements 121 enable one or both of optical elements 125, 127 to include or consist essentially of spherical lenses, which may be less complex and less costly than other focusing or collimating elements. The cross-coupling mitigation system addresses the possible situation in which two emitters, two adjacent emitters, form a lasing resonator via the partially reflecting output coupler 114. In such a situation, the two cross-coupled emitters run at a common wavelength in the cross-coupled resonator, and the two chiefs rays at this common wavelength typically form an angle in the WBC dimension after the dispersion element 112. A proper combination of optical elements 125 and 127 (and, in some embodiments, the spacing between optical element 127 and partially reflecting output coupler 114 (e.g., substantially equal to the focal length of optical element 127)) typically minimizes the overlap of two potentially cross-coupled beams at the partially reflecting output coupler 114 and, therefore, prevents the cross-coupling from occurring.

Figure 10:
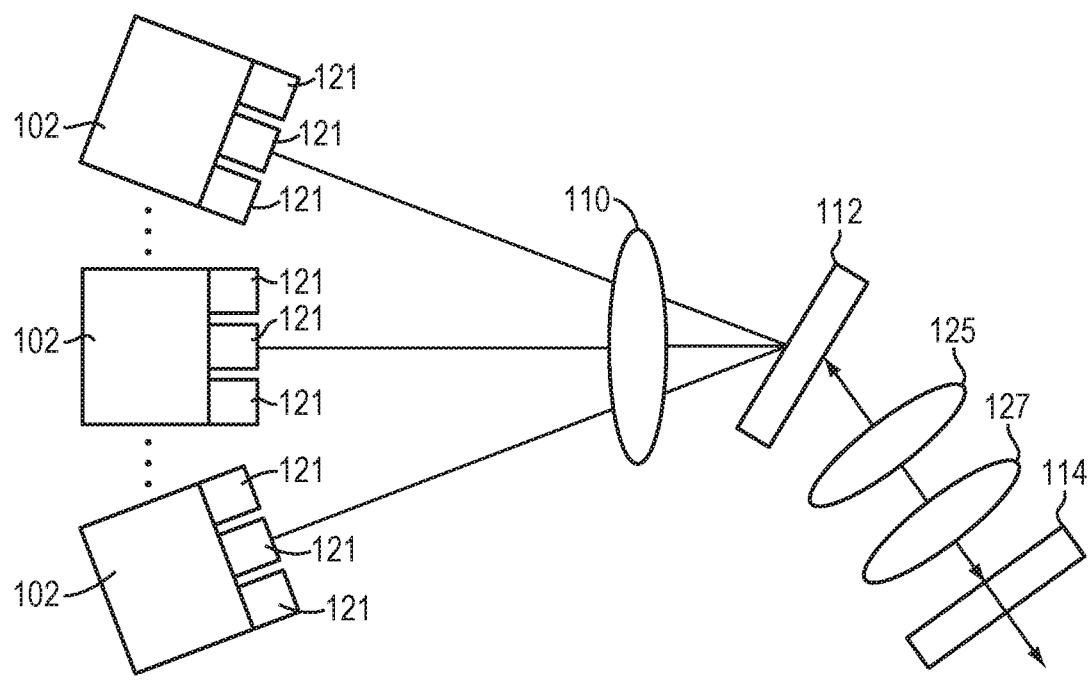
FIG. 10 is a schematic illustration of a WBC laser system incorporating individual micro-optic arrangements to collimate, rotate, and/or focus each individual beam from an array of diode bars each having multiple diode emitters in accordance with embodiments of the invention.

Embodiments of the invention may also couple the light from multiple different diode bars (e.g., an array of diode bars), as schematically illustrated in FIG. 10. Each diode bar 102 has multiple individual diode emitters each emitting a single beam (only one such beam is shown for each diode bar 102 for clarity), and each diode emitter is accompanied by an individual micro-optics arrangement 121. Each of the diode bars 102 may be spaced away from the focusing lens 110 by a distance approximately equal to the focal length of the focusing lens 110.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A multi-wavelength beam combining laser system for combining a plurality of beams along a beam combining dimension into a multi-wavelength beam comprising optical radiation having a plurality of wavelengths, the laser system comprising:
   a plurality of beam emitters each emitting a beam having a different wavelength;
   a dispersive element for (i) receiving the plurality of beams, (ii) dispersing the beams along the beam combining dimension, and (iii) transmitting the dispersed beams; and
   a partially reflective output coupler arranged to receive the dispersed beams transmitted by the dispersive element, reflect a first portion of the dispersed beams toward the dispersive element, and to transmit a second portion of the dispersed beams as the multi-wavelength beam,
   wherein the beam emitters are mechanically angled with respect to each other such that the beams converge toward a common region of the dispersive element.

2. The system of claim 1, wherein, between the beam emitters and the dispersive element, there are no focusing optics for focusing the beams onto the dispersive element.

3. The system of claim 1, wherein each beam emitter comprises a laser diode.

4. The system of claim 1, wherein each beam emitter comprises a fiber laser.

5. The system of claim 1, wherein the beams substantially overlap at the dispersive element.

6. The system of claim 1, wherein the dispersive element comprises a diffraction grating.

7. The system of claim 6, wherein the dispersive element comprises a reflective diffraction grating.

8. The system of claim 6, wherein the dispersive element comprises a transmissive diffracting grating.

9. The system of claim 1, further comprising one or more optical elements disposed between the beam emitters and the dispersive element.

10. The system of claim 1, wherein each beam emitter is an external-cavity beam emitter.

11. The system of claim 1, further comprising an optical fiber into which the multi-wavelength beam is coupled.

12. The system of claim 11, further comprising, for processing by the multi-wavelength beam, a workpiece disposed optically downstream of the optical fiber.

13. The system of claim 12, wherein the workpiece is metal.

14. The system of claim 1, further comprising means for adjusting a beam parameter product of the multi-wavelength beam.

15. The system of claim 1, wherein each beam emitter comprises a collimating optical element associated therewith.

16. A multi-wavelength beam combining laser system for combining a plurality of beams along a beam combining dimension into a multi-wavelength beam comprising optical radiation having a plurality of wavelengths, the laser system comprising:
   a plurality of beam emitters each emitting a beam having a different wavelength;
   a dispersive element for (i) receiving the plurality of beams, (ii) dispersing the beams along the beam combining dimension, and (iii) transmitting the dispersed beams; and
   a partially reflective output coupler arranged to receive the dispersed beams transmitted by the dispersive element, reflect a first portion of the dispersed beams toward the dispersive element, and to transmit a second portion of the dispersed beams as the multi-wavelength beam,
   wherein (i) the beam emitters are mechanically angled with respect to each other such that the beams converge toward a common region of the dispersive element, and (ii) the beams do not completely overlap at the dispersive element.

17. A multi-wavelength beam combining laser system for combining a plurality of beams along a beam combining dimension into a multi-wavelength beam comprising optical radiation having a plurality of wavelengths, the laser system comprising:
   a plurality of beam emitters each emitting a beam having a different wavelength;
   a dispersive element for (i) receiving the plurality of beams, (ii) dispersing the beams along the beam combining dimension, and (iii) transmitting the dispersed beams;
   a partially reflective output coupler arranged to receive the dispersed beams transmitted by the dispersive element, reflect a first portion of the dispersed beams toward the dispersive element, and to transmit a second portion of the dispersed beams as the multi-wavelength beam; and
   a cross-coupling mitigation system for preventing cross coupling of the beam emitters,
   wherein the beam emitters are mechanically angled with respect to each other such that the beams converge toward a common region of the dispersive element.

18. The system of claim 17, wherein the cross-coupling mitigation system comprises a plurality of optical elements.

19. The system of claim 17, wherein (i) the cross-coupling mitigation system comprises a first optical element having a focal length F1 and a second optical element, disposed optically downstream of the first optical element and having a focal length F2, and (ii) a ratio F1/F2 is two or greater.

20. The system of claim 17, wherein an optical distance between the first optical element and the second optical element is approximately F1+F2.

21. The system of claim 17, wherein the beams do not completely overlap at the dispersive element.

22. The system of claim 17, wherein the beams substantially overlap at the dispersive element.

* * * * *